(12) United States Patent
Namgoong et al.

(10) Patent No.: US 11,161,608 B2
(45) Date of Patent: Nov. 2, 2021

(54) UNMANNED AERIAL VEHICLE AND FLYING CONTROL METHOD THEREOF

(71) Applicant: Samsung Electronics Co., Ltd., Gyeonggi-do (KR)

(72) Inventors: Boram Namgoong, Gyeonggi-do (KR); Soopyoung Park, Gyeonggi-do (KR); Jihyun Park, Gyeonggi-do (KR); Gwanghui Lee, Gyeongsangbuk-do (KR); Moonseok Choi, Gyeonggi-do (KR)

(73) Assignee: Samsung Electronics Co., Ltd

( * ) Notice: Subject to any disclaimer, the term of this patent is extended or adjusted under 35 U.S.C. 154(b) by 345 days.

(21) Appl. No.: 15/790,473

(22) Filed: Oct. 23, 2017

(65) Prior Publication Data

US 2018/0111684 A1  Apr. 26, 2018

(30) Foreign Application Priority Data

Oct. 21, 2016 (KR) .................. 10-2016-0137490

(51) Int. Cl.
  *B64C 39/02* (2006.01)
  *G05D 1/10* (2006.01)
  *G08G 5/00* (2006.01)
  *H03K 17/96* (2006.01)

(52) U.S. Cl.
  CPC .......... *B64C 39/024* (2013.01); *G05D 1/101* (2013.01); *G08G 5/0013* (2013.01); *H03K 17/962* (2013.01); *B64C 2201/08* (2013.01); *B64C 2201/088* (2013.01); *B64C 2201/127* (2013.01); *B64C 2201/146* (2013.01); *B64C 2201/182* (2013.01)

(58) Field of Classification Search
  CPC ............ B64C 39/024; B64C 2201/146; B64C 2201/182; B64C 2201/088; G08G 5/0013; G05D 1/101
  See application file for complete search history.

(56) References Cited

U.S. PATENT DOCUMENTS

| | | | |
|---|---|---|---|
| 2014/0008496 A1 | 1/2014 | Ye et al. | |
| 2014/0131510 A1 | 5/2014 | Wang et al. | |
| 2015/0286216 A1 | 10/2015 | Miwa | |
| 2016/0041628 A1 | 2/2016 | Verma | |
| 2016/0139602 A1 | 5/2016 | Kohstall | |
| 2016/0313742 A1* | 10/2016 | Wang | G05D 1/0669 |
| 2017/0176992 A1* | 6/2017 | Wang | G05D 1/0088 |
| 2017/0309364 A1* | 10/2017 | Yamada | G02B 1/118 |

FOREIGN PATENT DOCUMENTS

| | | |
|---|---|---|
| EP | 0 544 483 | 6/1993 |
| WO | WO 2014/075609 | 5/2014 |
| WO | WO 2015/085598 | 6/2015 |
| WO | WO 2015/200209 | 12/2015 |

OTHER PUBLICATIONS

European Search Report dated Dec. 12, 2017 issued in counterpart application No. 17197517.0-1754, 7 pages.

* cited by examiner

*Primary Examiner* — Mathew Franklin Gordon
(74) *Attorney, Agent, or Firm* — The Farrell Law Firm, P.C.

(57) ABSTRACT

A UAV and a flying control method thereof that can detect a user grip of the UAV are provided. The UAV and a flying control method thereof can detect a user grip at a first position and can detect release of the user grip at a second position.

14 Claims, 12 Drawing Sheets

UNMANNED AERIAL VEHICLE AND FLYING CONTROL METHOD THEREOF

PRIORITY

This application claims priority under 35 U.S.C. § 119(a) to Korean Patent Application Serial No. 10-2016-0137490, which was filed in the Korean Intellectual Property Office on Oct. 21, 2016, the entire content of which is incorporated herein by reference.

BACKGROUND

1. Field of the Disclosure

The present disclosure relates to an unmanned aerial vehicle (UAV) and a flying control method thereof, and more particularly, to a UAV and a flying control method that can detect a user grip on the UAV.

2. Description of Related Art

Modern UAVs, including drones, can fly while taking photographs and video that includes audio.

The UAV can manually take-off, land, and fly under the control of a remote controller. Further, the UAV can fly automatically in stand-alone mode with no user interaction.

The flying UAV may maintain a hovering state. Even if the hovering UAV is disturbed from the current position in a three-dimensional space to another position due to an external force such as the wind, the UAV may return to the original position using one or more sensors.

SUMMARY

An aspect of the present disclosure provides a UAV and a flying control method thereof that can detect a user grip on the UAV.

In accordance with an aspect of the present disclosure, a UAV includes a positioning information receiver; at least one sensor that detects a flight state of the UAV; a driving unit including an electronic speed controller (ESC) and a motor that operates to fly the UAV; a grip detection circuit positioned within the UAV that receives a user grip; and a processor that controls the positioning information receiver, the at least one sensor, the driving unit, and the grip detection circuit. The processor controls the detection of the user grip and release of the user grip through the grip detection circuit of the flying UAV using the positioning information receiver, the at least one sensor, and the driving unit.

BRIEF DESCRIPTION OF THE DRAWINGS

The objects, features, and advantages of the present disclosure will be more apparent from the following detailed description taken in conjunction with the accompanying drawings, in which.

DETAILED DESCRIPTION

Figure 1A:
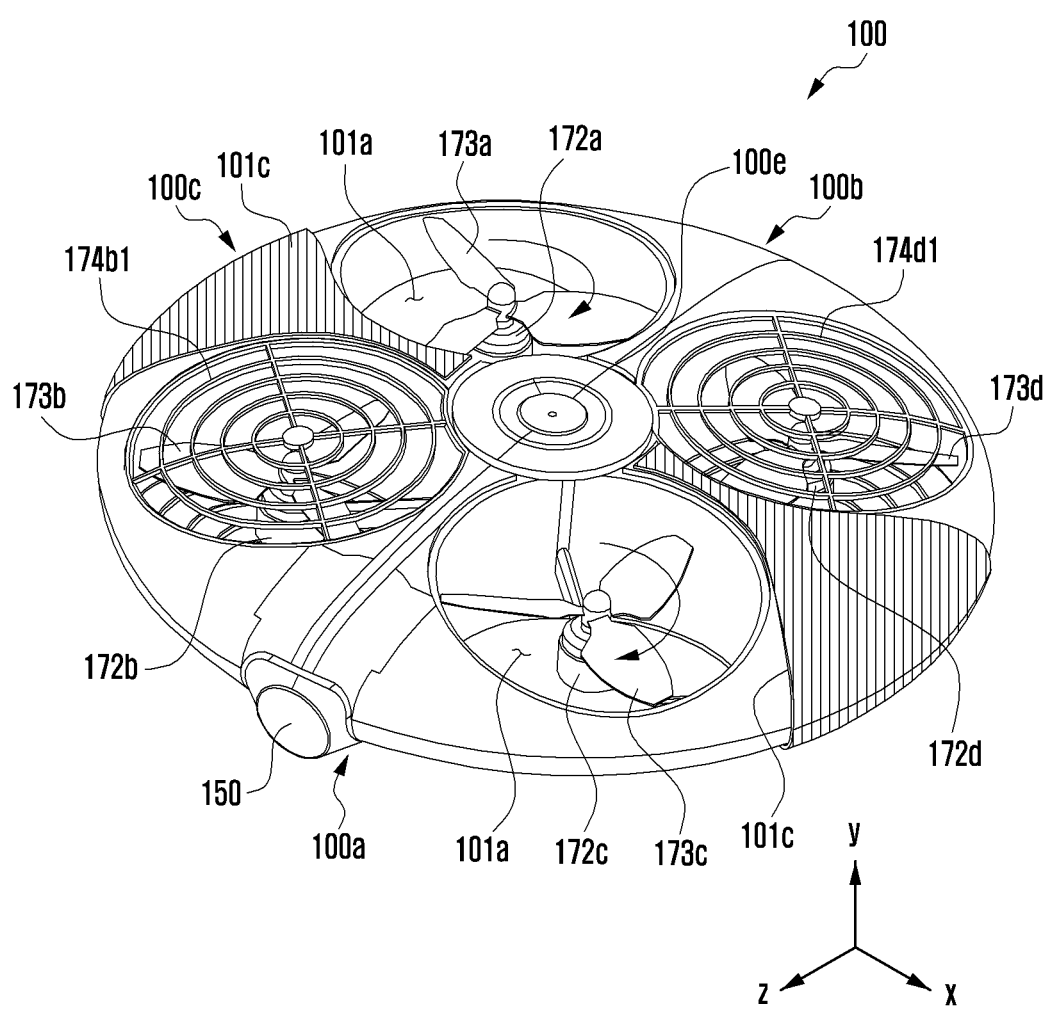
FIGS. 1A to 1D are perspective views illustrating a UAV according to an embodiment of the present disclosure.

Descriptions of well-known functions and constructions may be omitted for clarity and conciseness. The terms and words used in the present disclosure and claims are not limited to their dictionary meanings, but are merely used to enable a clear and consistent understanding of the present disclosure.

The singular forms "a," "an," and "the" include plural referents unless the context clearly indicates otherwise. Thus, for example, reference to a component surface includes reference to one or more of such surfaces.

In the present disclosure, the expressions "A or B" or "at least one of A and/or B" may include A, may include B, or may include both A and B. Expressions including ordinal numbers, such as "first", "second", etc., may modify various elements. However, the above expressions do not limit the sequence and/or importance of the elements and are used for the purpose to distinguish an element from the other elements. In case where a certain (e.g., the first) element is referred to as being "connected" or "accessed" (functionally or communicatively) to other (e.g., the second) element, it should be understood that the element is connected or accessed directly to the other element or through another (e.g., the third) element.

In the present disclosure, the expression "configured to" may be used, depending on situations, interchangeably with "adapted to", "having the ability to", "modified to", "made to", "capable of", or "designed to". In some situations, the expression "device configured to" may mean that the device may operate with other device(s) or other component(s). For example, the expression "processor configured to perform A, B and C" may mean a dedicated processor (e.g., an embedded processor) for performing the above operations, or a general-purpose processor (e.g., central processing unit (CPU) or an application processor (AP)) capable of performing the above operations by executing one or more software programs stored in a memory device.

An electronic device according to embodiments of the present disclosure may include at least one of a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer 3 (MP3) player, a medical device, a camera, and a wearable device. For example, a wearable device may include at least one of an accessory type (e.g., a watch, a ring, a bracelet, an anklet, a necklace, an electronic accessory, eyeglasses, contact lenses, or a head-mounted device (HMD)), a textile or cloth assembled type (e.g., electronic clothing), a body attached type (e.g., a skin pad or tattoo), and a body transplant circuit. In some embodiments of the present disclosure, an electronic device may include at least one of a television (TV), a digital versatile disc (DVD) player, an audio device, a refrigerator, an air-conditioner, a vacuum cleaner, an oven, a microwave, a washing machine, an air cleaner, a set-top box, a home automation control panel, a security control panel, a media box (e.g., Samsung HomeSync™, Apple TV™, or Google TV™), a game console (e.g., Xbox™, PlayStation™), an electronic dictionary, an electronic key, a camcorder, and an electronic frame.

In embodiments of the present disclosure, an electronic device may include at least one of medical devices (e.g., magnetic resonance angiography (MRA), magnetic resonance imaging (MRI), computed tomography (CT), a scanning machine, an ultrasonic wave device, etc.), a navigation device, a global navigation satellite system (GNSS), an event data recorder (EDR), a flight data recorder (FDR), a vehicle infotainment device, an electronic equipment for a ship (e.g., navigation equipment for a ship, gyrocompass, etc.), avionics, a security device, a head unit or device for a vehicle, an industrial or home robot, a drone, an automated teller machine (ATM), a point of sales (POS) device, and Internet of things (IoT) devices (e.g., a lamp, sensors, a sprinkler, a fire alarm, a thermostat, a street light, a toaster, athletic equipment, a hot water tank, a heater, a boiler, etc.).

According to an embodiment of the present disclosure, an electronic device may include at least one of furniture, a portion of a building/structure or car, an electronic board, an electronic signature receiving device, a projector, and measuring meters (e.g., a water meter, an electric meter, a gas meter, a wave meter, etc.). An electronic device may be flexible, or a combination of two or more of the aforementioned devices. An electronic device according to the present disclosure is not limited to the aforementioned devices. In the present disclosure, the term user may refer to a person who uses an electronic device, or a machine (e.g., an artificial intelligence electronic device) which uses an electronic device.

FIGS. 1A to 1D are perspective views illustrating a UAV according to an embodiment of the present disclosure.

With reference to FIGS. 1A to 1D, at a front surface 100a of an UAV 100, a camera 150 may be positioned. The camera 150 may be positioned at the bottom 100d (see FIG. 1D) of the UAV 100, or at the low end of the front surface 100a of the UAV 100. Further, the UAV 100 may include a gimbal that maintains the camera 150 at a preset angle separately from a movement (e.g., flying) thereof.

The UAV 100 may include a housing 101 including a frame, a plurality of motors 172, and a plurality of propellers 173 corresponding to the number of motors 172. In a central area 100e of the UAV 100, a main board may be positioned. Further, a battery 195 may be positioned to face the main board positioned at a central area 100e of the UAV 100.

The housing 101 houses a frame, a plurality of motors 172, and a plurality of propellers 173 corresponding to the number of motors 172, and has openings 101a to be same number as the number of propellers 173. Further, the UAV 100 may include a frame, a plurality of motors 172, and a plurality of propellers 173 without the housing 101.

The housing 101 may be partially made from light plastic and may be partially made of metal. For example, a material of the housing 101 may include polypropylene, polycarbonate, and acrylonitrile butadiene styrene resin (ABS resin). The aforementioned material of the housing 101 is an example and is not limited thereto.

The UAV 100 may have a plurality of (e.g., 2, 3, 4, 6, 8, or etc.) propellers 173. The UAV 100 may have the numbers of motors 172 to be the same as the number of propellers 173.

A controller 110 of the UAV 100 may detect a user grip through a circuit (e.g., a grip detection circuit 166s) positioned within the housing 101. The controller 110 of the UAV 100 may detect a user grip through the circuit (e.g., the grip detection circuit 166s) positioned within a grip sensor 166 and the housing 101. Further, the controller 110 of the UAV 100 may receive an electric signal corresponding to a user grip detected through the circuit (e.g., the grip detection circuit 166s) positioned within the housing 101 from the grip sensor 166.

In an embodiment of the present disclosure, the UAV 100 may have four propellers, but the present disclosure is not limited thereto.

The UAV 100 may further include a cover 174 that protects the propeller 173 within an opening 101a. The cover 174 may be positioned in at least one of an upper portion and a lower portion of the propeller 173 within the opening 101a. Further, the number of covers 174 may be less than or equal to the number of propellers 173.

Figure 1B:
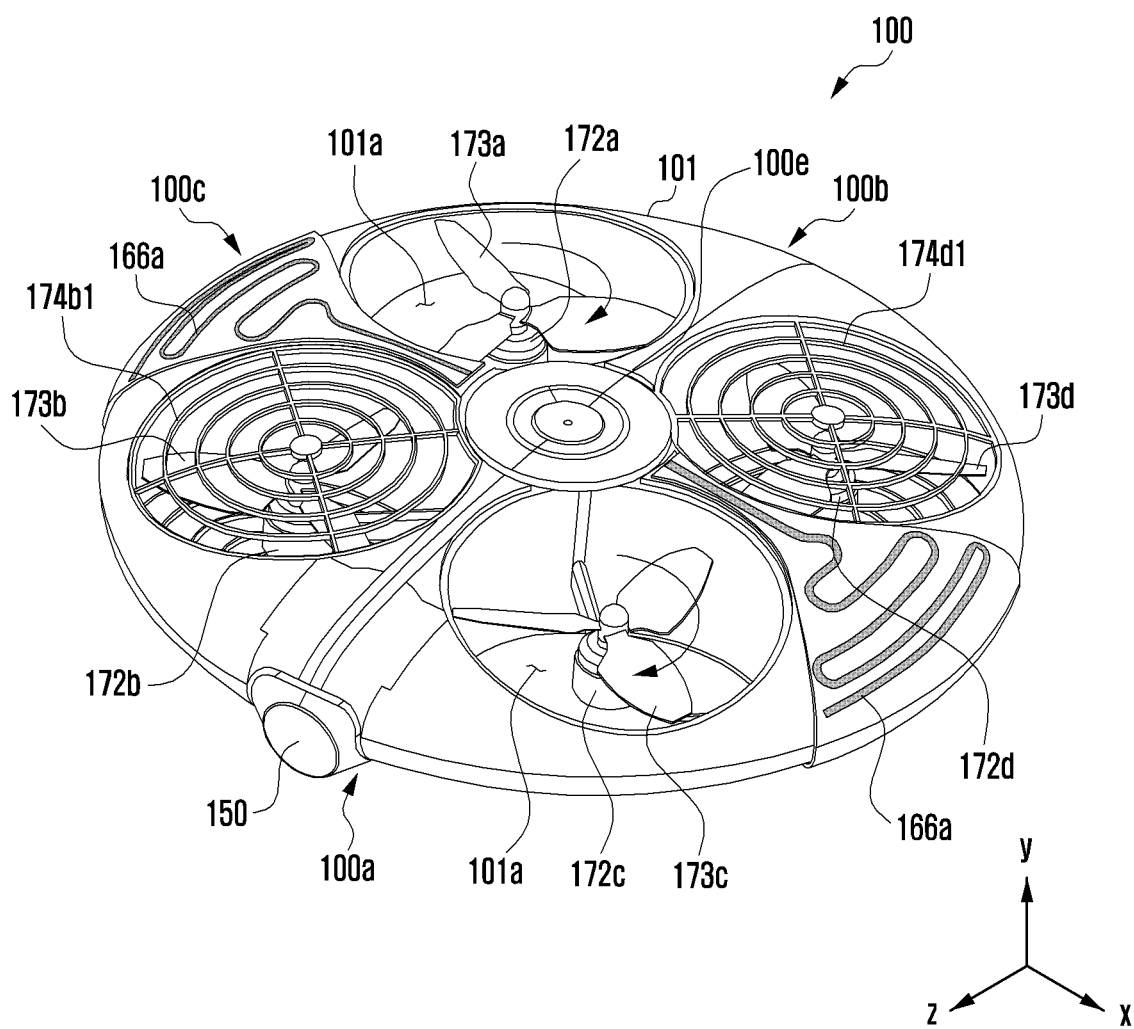

With reference to FIG. 1B, a portion that is not the opening 101a of a surface of the housing 101 of the UAV 100 may have a continuous conductive pattern 166a attached. Further, at a portion that is not an area corresponding to the installed camera 150 of a surface of the housing 101 of the UAV 100, may have a continuous conductive pattern 166a attached. In at least one of an upper surface 101a and a lower surface 101d of the housing 101 of the UAV 100, the conductive pattern 166a may be attached.

Figure 1C:
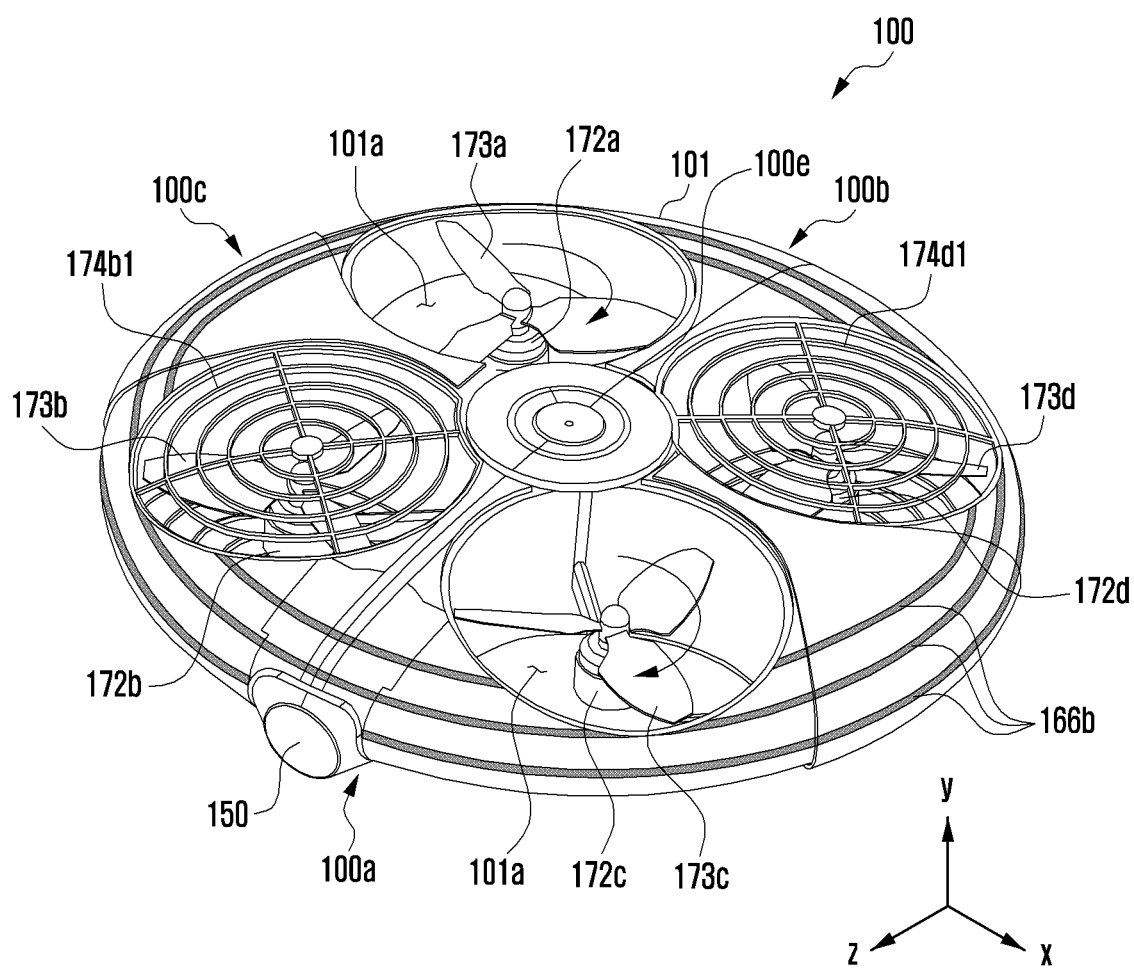

With reference to FIG. 1C, on a surface of the housing 101 of the UAV 100, a circular conductive pattern 166b may be attached. The circular conductive pattern 166b may include a plurality of circular conductive patterns.

The circular conductive pattern 166b may be attached to an area within 50 mm from a corner of the UAV 100. Further, the circular conductive pattern 166b may be attached to an area separated by 1 mm to 80 mm from a corner of the UAV 100.

In an embodiment of the present disclosure, the housing 101 may have attached a plurality of circular conductive patterns 166b in at least one of the upper surface 101a and the lower surface 101d of the housing 101 of the UAV 100.

The conductive pattern 166b may be made of partial segments that are electrically connected.

In FIGS. 1B and 1C, the conductive patterns 166a and 166b are formed to detect a user grip and may be implemented with a conductor, conductive wire, conductive paint, conductive film, a flexible printed circuit board (PCB), or a capacitor.

The controller 110 of the UAV 100 may receive a user grip signal through the conductive pattern 166a.

Figure 1D:
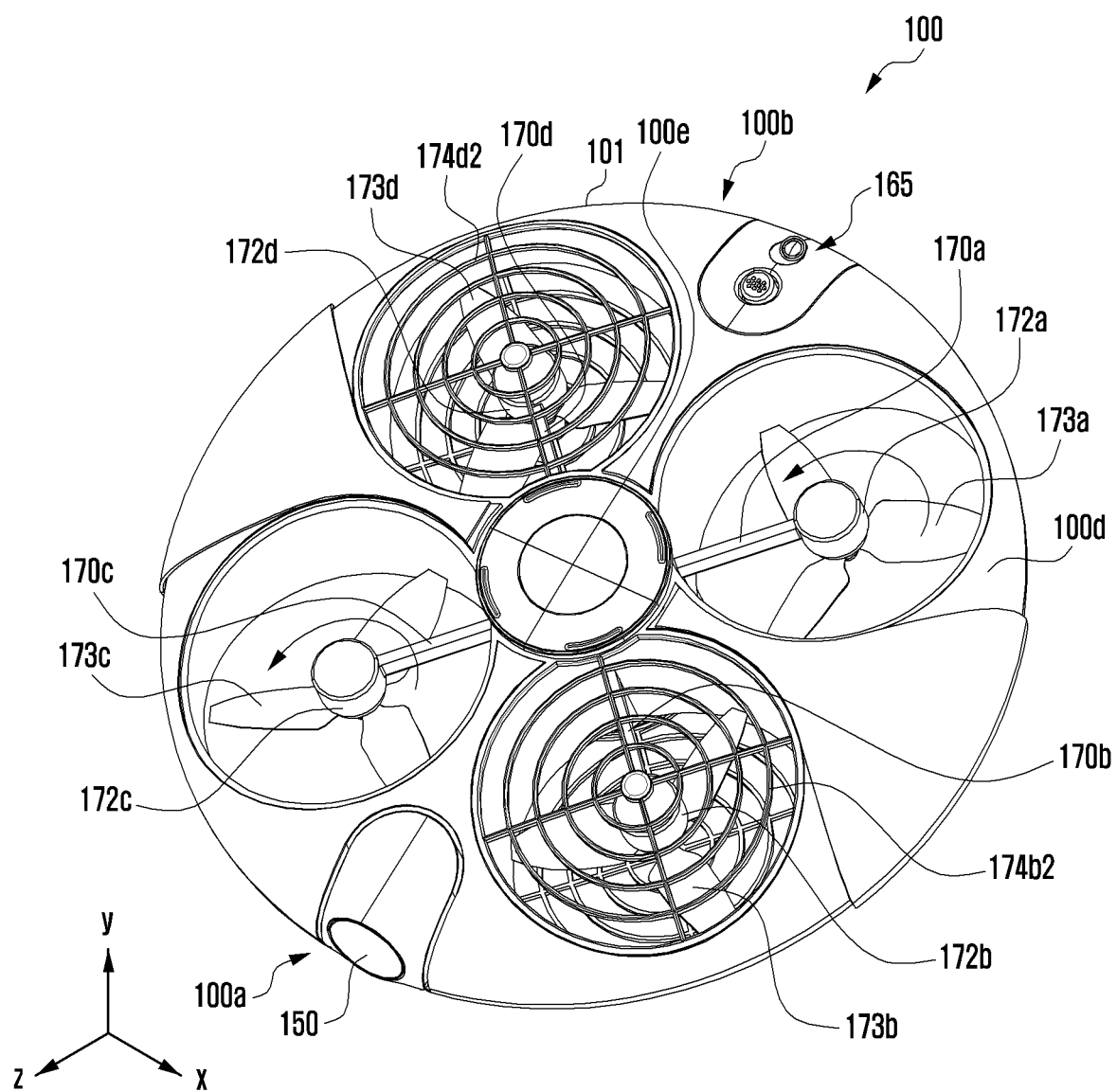

With reference to FIG. 1D, in an embodiment of the present disclosure the bottom 100d of the UAV 100 is shown. At the bottom 100d of the UAV 100, an optical flow sensor 165 or an optical flow camera may be attached to maintain hovering at the current position. Further, a landing gear may be coupled to the bottom 100d of the UAV 100.

Figure 2:
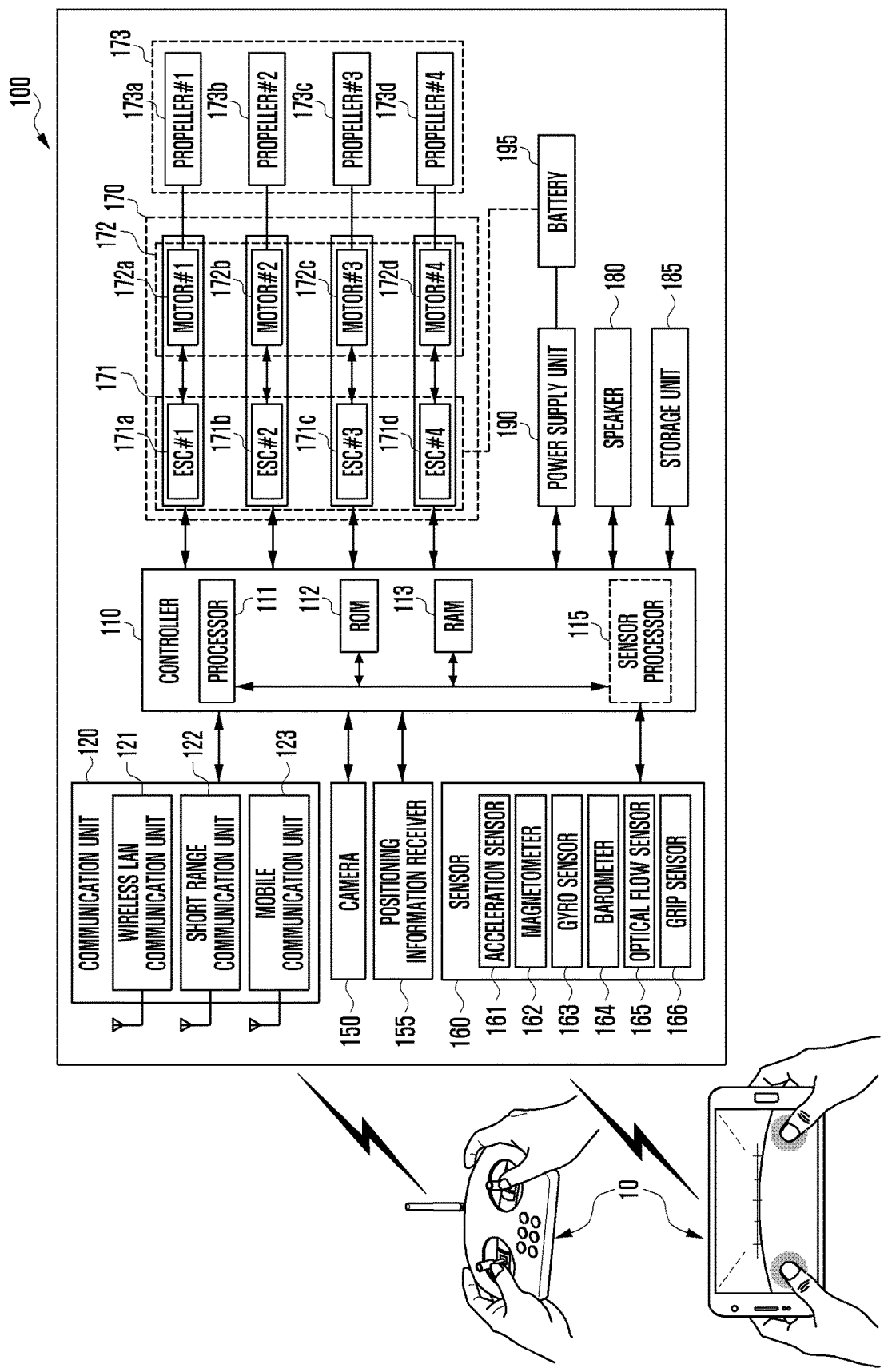
FIG. 2 is a block diagram illustrating a configuration of a UAV according to an embodiment of the present disclosure.

FIG. 2 is a block diagram illustrating a configuration of a UAV according to an embodiment of the present disclosure.

With reference to FIGS. 1A to 2, the UAV 100 may be functionally connected to a remote controller 10 or a server using communication unit 120.

The UAV 100 may transmit flight information and other data (e.g., photographs and video) to an external electronic device or may receive flight information from an external electronic device through the communication unit 120.

The UAV 100 may include a controller 110, communication unit 120, camera 150, positioning information receiver 155, sensor 160, driving unit 170, speaker 180, storage unit 185, power supply unit 190, and battery 195.

The controller 110 may include a processor (e.g., flight processor) 111. Further, the controller 110 may include a read-only memory (ROM) 112 that stores a control program for the control of the UAV 100 and a random-access memory (RAM) 113 used as a storage area for flight control information, flight information, and photographing data received from an external electronic device or operations (e.g., delivery, racing, or crop-dusting) corresponding to flying of the UAV 100.

The controller 110 may collect flight information, detect a position of the UAV 100 using the sensor 160, control a rotation speed of the motors 172 (e.g., 172a, 172b, 172c, 172d, and so on) for position correction, calculate a position of the UAV 100 using the positioning information receiver 155, and monitor a system state of the UAV 100.

The controller 110 may control operation (e.g., take-off, landing, flight) of the UAV 100 and signal flow between components (e.g., 110 to 190) of the UAV 100, and processing data. The controller 110 may control power supply to components (e.g., 120 to 185) using the power supply unit 190.

The processor 111 may include a sensor processor 115 that calculates a flight state or a peripheral environment of the UAV 100 using one or more of analog data and digital data received from a plurality of sensors of the UAV 100. Further, the processor 111 may further include a communication processor that controls communication between the UAV 100 and external electronic devices.

The processor 111 may be implemented in a system on chip (SoC) including a core and sensor processor 115. The processor 111 may have the functionality of sensor processor 115 integrated. Further, the processor 111 may include a single core, dual core, triple core, quad core, and a multiple core thereof. The processor 111, ROM 112, and RAM 113 may be electrically connected.

The controller 110 may control the communication unit 120, the camera 150, the positioning information receiver 155, the sensor 160, the driving unit 170, the speaker 180, the storage unit 185, and the power supply unit 190.

A UAV according to an embodiment of the present disclosure includes a positioning information receiver, at least one sensor that detects a flight state of the UAV, an ESC, and a motor; and a processor or controller that controls a driving unit that operates to hover the UAV and a grip detection circuit positioned within the UAV that receives a user grip; controls operation of the driving unit according to the user grip detected through the grip detection circuit of the UAV flying at a first position using the at least one sensor and the driving unit; sets a second position moved from the first position to a reference position, when release of the user grip is detected; and controls to fly the UAV using the at least one sensor and the driving unit.

The processor may compare a rotation speed of the motor with a rotation speed at the first position according to the detected user grip to control the ESC and the motor to reduce the rotation speed of the motor.

The processor may detect a capacitance change of the grip detection circuit that corresponds to the user grip.

The grip detection circuit may include a plurality of grip detection circuits, and the processor may detect each capacitance change in an adjacent left grip detection circuit and right grip detection circuit according to a position of the user grip.

The UAV may further include a housing having a conductive pattern on a surface, and the processor may receive a user grip signal through the conductive pattern.

When the user grip is released and when the second position is different from the first position, the processor may control the driving unit to hover the UAV at the second position.

The processor may control operation of the driving unit to terminate driving of the UAV at the first position to correspond to the detection of a user gripping the user grip.

The processor may detect a capacitance change of the grip detection circuit corresponding to release of the user grip by the user.

In an embodiment of the present disclosure, a controller of the UAV 100 may include a processor 111, ROM 112, and RAM 113. Further, the controller of the UAV 100 may be a processor (e.g., flight processor 111).

The communication unit 120 may be connected to an external electronic device through a communication network using a plurality of antennas under the control of the controller 110. The communication unit 120 may transmit flight information and photographing data of the UAV 100 to external electronic devices under the control of the controller 110. Further, the communication unit 120 may receive flight control information from an external electronic device under the control of the controller 110.

The communication unit 120 may include a wireless LAN communication unit 121, short range communication unit 122, or mobile communication unit 123.

The wireless LAN communication unit 121 and/or the short range communication unit 122 may be connected to the remote controller 10 or a server using a plurality of antennas under the control of the controller 110. The wireless LAN communication unit 121 may support, for example, Wi-Fi communication. The short range communication unit 122 may include Bluetooth® communication, Bluetooth low energy (BLE) communication, Infrared Data Association (IrDA), ultra-wideband (UWB) communication, magnetic secure transmission (MST) communication, and/or NFC communication.

The mobile communication unit 123 may be connected to a remote controller 10 or a server through a communication network using a plurality of antennas under the control of the controller 110.

The UAV 100 may include a plurality of the wireless LAN communication unit 121, the short range communication unit 122, the mobile communication unit 123 or a combination of the wireless LAN communication unit 121, the short range communication unit 122, and the mobile communication unit 123.

In embodiments of the present disclosure, the communication unit may include a wireless LAN communication unit 121, short range communication unit 122, and/or mobile communication unit 123.

The camera 150 may perform image capture to obtain a still picture or a moving picture under the control of the controller 110. The camera 150 may include an auxiliary light source (e.g., flashlight or a flash) that provides enough light intensity to capture an image or video.

The UAV 100 may further include a front camera 150 and an additional camera adjacent to (e.g., a gap between two optical axes is 3 mm to 80 mm) the camera 150. The camera 150 and the additional camera may be integrated in one unit. The controller 110 may control image capture to obtain a three-dimensional still picture or a three-dimensional moving picture using the camera 150 and the additional camera.

The UAV 100 may include a gimbal attached to the camera 150 in order to acquire stable video data. The gimbal may be a 3-axis gimbal. The gimbal may further include a plurality of separate motors for adjusting an angle of the camera 150.

The positioning information receiver 155 periodically receives a signal (e.g., orbit information of a global positioning system (GPS) satellite, time information, and navigation message of the satellite) from a plurality of satellites in the earth's orbit. The positioning information receiver 155 may be positioned at the central area 100e of the UAV 100.

The UAV 100 may calculate a position of each satellite and the UAV 100 using signals received from a plurality of satellites and calculate a distance using the transmitting/receiving time difference. The UAV 100 may calculate each of the current position, current time, altitude, and moving speed of the UAV 100 through triangulation. The UAV 100 may calculate each of the current position, the current time, the current altitude, and the current moving speed thereof using the positioning information receiver 155.

The UAV 100 may correct (e.g., hovering or auto return mode that returns to a take-off position) a position using a calculated position or a moving speed.

The UAV 100 may maintain (e.g., hover) the current position (or a preset position received from the remote controller 10) using the positioning information receiver 155 and the optical flow sensor 165 (e.g., a camera and an ultrasonic sensor). For example, the UAV 100 may limit a movement by an error of an external force (e.g., wind, snow, or rain) or an internal control (e.g., motor control) while flying using the optical flow sensor 165 to maintain the current position and the current altitude.

The sensor 160 may detect a flight state and/or a peripheral environment of the UAV 100. The sensor 160 may detect a physical quantity corresponding to the UAV 100 and/or a peripheral environment. The sensor 160 may convert a detected physical quantity to an electric signal and output the electric signal to the controller 110, the processor 111, or the sensor processor 115.

The sensor 160 may include an acceleration sensor 161 that measures acceleration of the UAV 100, magnetometer 162 that detects the direction of magnetic north of the UAV 100, gyro sensor 163 that detects a rotation angular velocity of the UAV 100, barometer 164 that detects the current altitude of the UAV 100, optical flow sensor 165, and/or grip sensor 166.

The controller 110 may calculate a flight state of the UAV 100 using the sensor 160. A flight state of the UAV 100 may include a rotational state and a translational state. The rotational state may mean yaw, pitch, and roll. The rotational state may be detected by the acceleration sensor 161, the magnetometer 162, and/or the gyro sensor 163.

The translational state may refer to longitude, latitude, altitude, and velocity. The translational state may be detected by the positioning information receiver 155 and the barometer 164.

The UAV 100 may fly using the calculated flight state. The controller 110 may output a pulse width modulation (PWM) signal for driving the driving unit 170 to correspond to the calculated flight state.

The driving unit 170 may take-off, land, or fly the UAV 100 to correspond to a PWM signal received from the controller 110. The driving unit 170 may include an ESC 171, a plurality of motors 172, and a plurality of propellers 173.

The ESC 171 may control a rotation speed of a plurality of motors 172. The ESC 171 may control (e.g., accelerate, decelerate, or reversely rotate) a plurality of motors 172 according to a received PWM signal. The ESC 171 may control one motor 172. Further, one ESC may control a plurality of motors 172.

The ESC 171 may be positioned at an arm 170a of the UAV 100, between the arm 170a and the central area 100e, or within the central area 100e of the UAV 100. Further, the ESC 171 may be positioned at a main board within the central area 100e of the UAV 100.

The ESC 171 may include a battery eliminator circuit (BEC) that converts a high voltage (e.g., 11.1 V or more) of the battery 195 to a low voltage (e.g., 5 V) necessary for driving a motor. Further, the ESC 171 may include an optoisolator (OPTO) that converts a signal received from the controller 110 to light and an external BEC.

The ESC 171 may convert DC power of the battery 195 to AC power and supply AC power to the motor 172. Further, the controller 110 may convert DC power of the battery 195 to AC power using the power supply unit 190 and supply AC power to the motor 172.

The motor 172 may be driven (e.g., rotated, stopped, accelerated, or decelerated) by the ESC 171. The motor 172 may be positioned to one end of the arm 170a of the UAV 100. The motor 172 may include a brushless DC motor (BLDC motor).

When the UAV 100 is a quadrotor, the number of the motors 172 is four. Two motors (e.g., 172a, 172c) of the four motors 172a to 172d may rotate clockwise. The remaining two motors (e.g., 172b, 172d) may rotate counterclockwise. A rotation direction of the motor 172 may be changed to correspond to the number of the motors 172 used by the UAV 100.

The propeller 173 may be coupled to a shaft of the motor 172 causing the shaft to rotate according to a rotation direction of a shaft. The UAV 100 may fly by the rotating propeller 173. The UAV 100 may hover, yaw right, yaw left, pitch down, pitch up, roll left, roll right, move upward, and move downward according to a rotation of the motor 172 and the propeller 173. Further, the UAV 100 may hover, yaw right, yaw left, pitch down, pitch up, roll left, roll right, move upward, and move downward by the motor 172 and the propeller 173 rotating to correspond to flight control information from the remote controller 10.

The speaker 180 may output a sound corresponding to a state (e.g., power on/off, flying, battery low) of the UAV 100 under the control of the controller 110. At the front surface 100a, a rear surface 100b, and/or the bottom 100d of the UAV 100, a plurality of speakers 180 may be positioned.

The storage unit 185 may store a signal or data input/output to correspond to operation of components (e.g., 120 to 190) under the control of the controller 110. The storage unit 185 may store a control program for the control of the controller 110 or the UAV 100. Further, the storage unit 185 may store flight control information (e.g., flying, rotation, hovering) received from an external electronic device or from the remote controller 10, an electric signal received from the sensor 160, flight information (e.g., position, velocity, battery residual quantity) of the UAV 100, control information of the camera 150, and/or video data (including image or audio) captured by the camera 150.

In an embodiment of the present disclosure, the storage unit includes a storage unit 185, ROM 112, and RAM 113 within the controller 110, or a memory card (e.g., micro SD card not shown) mounted in the UAV 100. The storage unit 185 may include a nonvolatile memory, volatile memory, hard disk drive (HDD), or solid state drive (SSD).

The power supply unit 190 may supply power of the battery 195 to components (e.g., 120 to 190) of the UAV 100 under the control of the controller 110. The power supply unit 190 may charge a plurality of batteries 195 under the control of the controller 110. Further, the controller 110 may convert DC power of the battery 195 to AC power using the power supply unit 190 and supply AC power to the motor 172.

The battery 195 includes a battery pack and may be positioned at the central area 100e of the UAV 100 or within the housing 101 of the UAV 100. Further, the battery 195 may be coupled to or detached from the central area 100e of the UAV 100.

In components of the UAV 100 of FIGS. 1A to 2, it may be easily understood by a person of ordinary skill in the art that at least one component may be added (e.g., a gimbal), removed (e.g., a speaker), or changed to correspond to an adjustment in the performance of the UAV 100.

Figure 3:
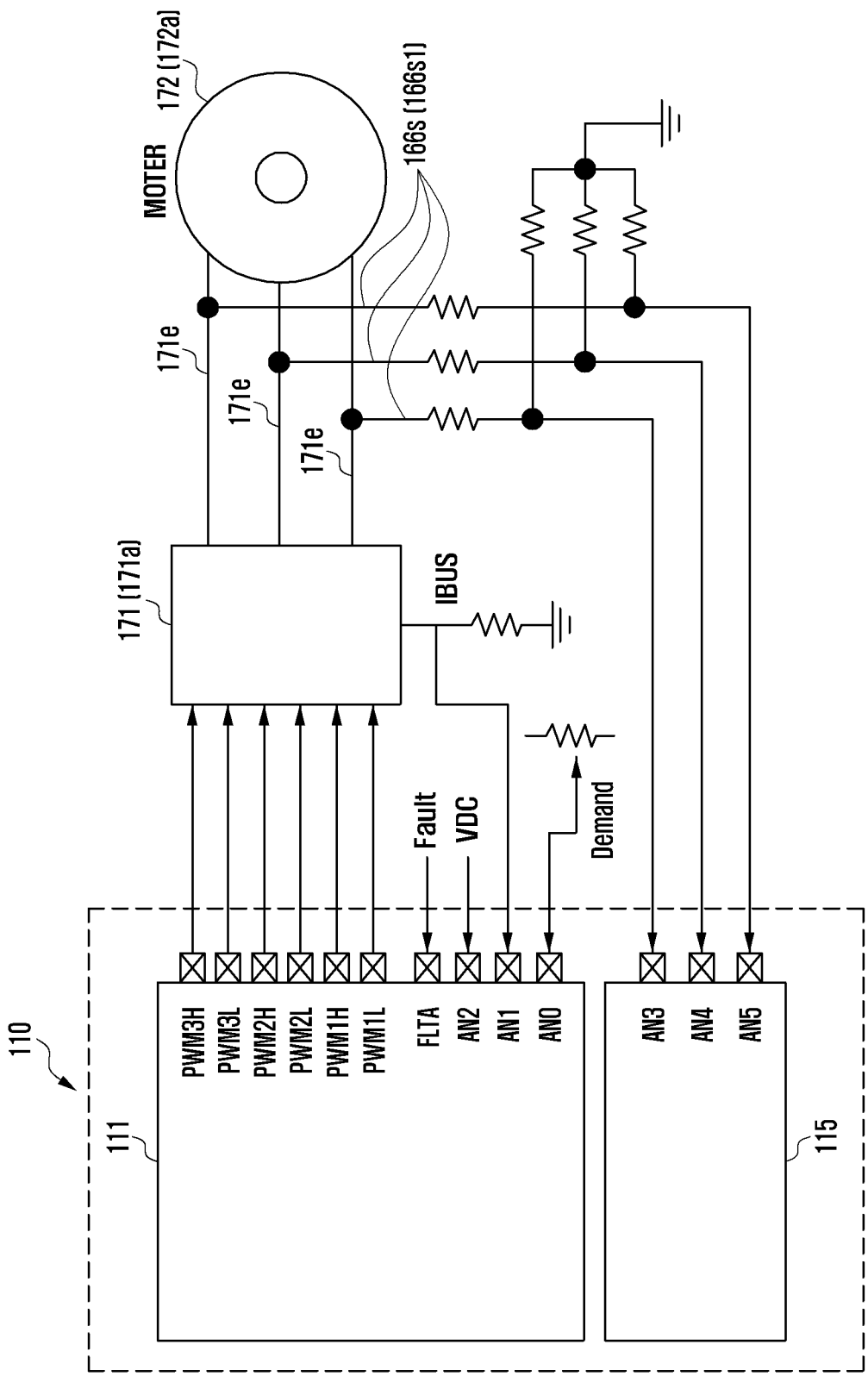
FIG. 3 is a circuit diagram illustrating a process for detecting a user grip of a UAV according to an embodiment of the present disclosure

FIG. 3 is a circuit diagram illustrating a process for detecting a user grip of a UAV according to an embodiment of the present disclosure.

With reference to FIG. 3, the processor 111 transmits a PWM signal to the ESC 171 through a circuit or a wire attached to (e.g., soldered) a main board. The ESC 171 connected to the motor 172 by wire may control the motor 172 using a PWM signal. The ESC 171 may provide a current of another phase (e.g., 3 phase) corresponding to a rotation of the motor 172.

As shown in FIG. 3, the ESC 171 may include a plurality of ESCs 171a to 171d. The motor 172 may include a plurality of motors 172a to 172d. Further, the grip detection circuit 166s may include a plurality of grip detection circuits 166s1 to 166s4. In an embodiment of the present disclosure, the number of the grip detection circuits 166s may be less than or equal to the number of motors 172. Further, in an embodiment of the present disclosure, the number of the grip detection circuits 166s may be less than or equal to the number of ESCs 171.

One end of the grip detection circuit or the conductive wiring 166s may be connected to the circuit 171e between the ESC 171 and the motor 172, and the other end thereof may be connected to the sensor processor 115. Further, one end of the grip detection circuit 166s may be connected to the circuit 171e between the ESC 171 and the motor 172, and the other end thereof may be connected to a grip sensor. The grip sensor may be connected to the sensor processor 115 or the processor 111.

The sensor processor 115 or the processor 111 may detect a user grip by using a capacitance change of a grip detection circuit. For example, the sensor processor 115 may detect a user grip using a change between a capacitance value before the user grips the UAV and a capacitance value after the user grips the UAV. Further, the sensor processor 115 or the processor 111 via a plurality of grip detection circuits may detect a user grip by using a change of the capacitance of the grip detection circuits corresponding to where a user gripped the UAV and a change of the capacitance value of the remaining plurality of grip detection circuits.

The circuit 171e between the ESC 171 and the motor 172 may be connected to one end of the conductive pattern 166a or 166b and the sensor processor 115 or the controller 110. Further, the circuit 171e between the ESC 171 and the motor 172 may be connected to one end of the conductive pattern 166a or 166b and the sensor processor 115 or the processor 111. Further, the circuit 171e between the ESC 171 and the motor 172 may be connected to one end of the conductive pattern 166a or 166b and a grip sensor. The grip sensor may be connected to the sensor processor 115 or the processor 111.

The circuit 171e between the ESC 171 and the motor 172, and the conductive pattern 166a or 166b may be connected using a direct connection method including soldering, c-clip, and pogo-pin and an indirect connection method using coupling between conductive materials and may be connected by an antenna pattern or a capacitor implemented into a printed circuit board (PCB).

The controller or a processor integrated with the sensor processor 115 may detect a user grip using a capacitance change of a conductive wiring. For example, the controller or a processor implemented integrally with the sensor processor 115 may detect a user grip using a difference between a capacitance value before the user grip and a capacitance value after the user grip.

A separate additional circuit may be further added which is connected to the circuit 171e between the ESC 171 and the motor 172 and the processor 111. Further, a separate additional circuit may be added which is connected to the circuit 171e between the ESC 171 and the motor 172, the conductive pattern 166a or 166b, and the processor 111.

The additional circuit may include a block circuit that limits interference of a motor control line that connects the ESC 171 and the motor 172 and a feedback line, a noise filter circuit that limits interference from vibration of the motor 172, a DC-noise filter circuit that removes DC-noise of the ESC 171, and a sensitivity tuning circuit or an electric shock prevention circuit. The additional circuit is an example and may be a circuit that limits interference in the circuit 171e between the ESC 171 and the motor 172 and the processor 111, the circuit 171e between the ESC 171 and the motor 172, or a circuit that limits connection of the conductive pattern 166a or 166b and the processor 111.

Figure 4:
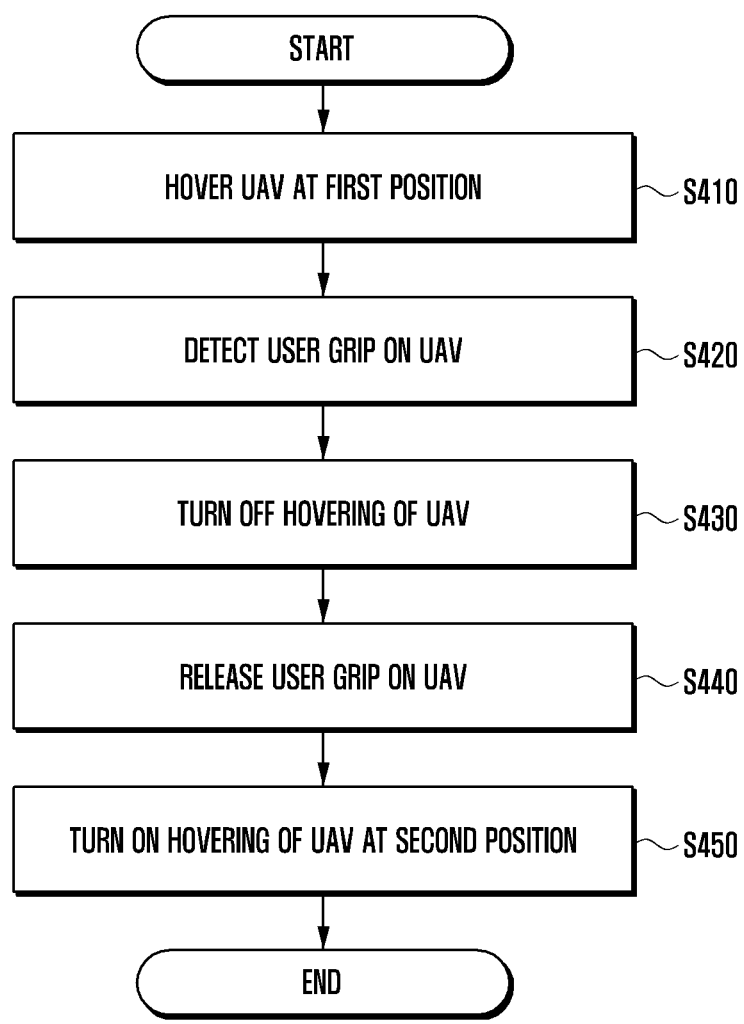
FIG. 4 is a flowchart illustrating a flying control method of a UAV according to an embodiment of the present disclosure.

FIG. 4 is a flowchart illustrating a flying control method of a UAV according to an embodiment of the present disclosure.

FIGS. 5A to 5E are diagrams illustrating an example of a flying control method according to an embodiment of the present disclosure.

At step S410 of FIG. 4, at a first position, the UAV hovers.

Figure 5A:
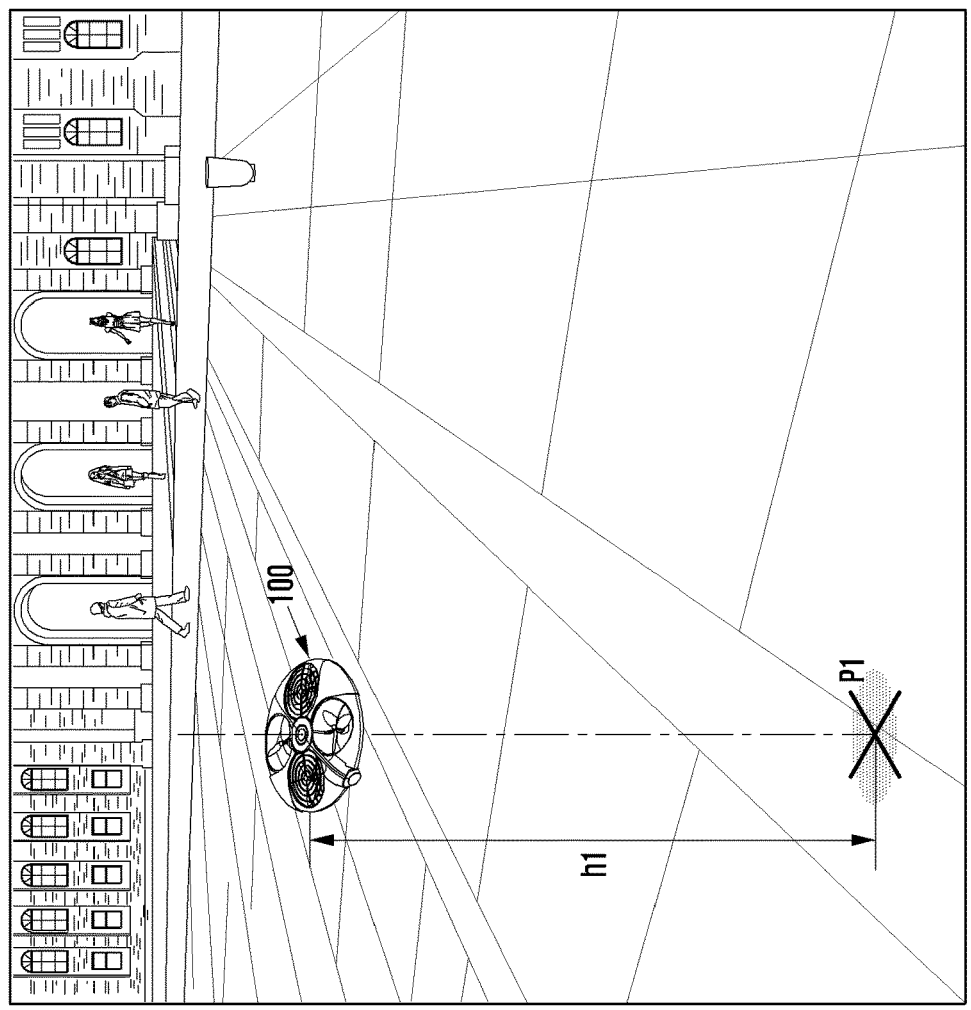
FIGS. 5A to 5E are diagrams illustrating an example of a flying control method according to an embodiment of the present disclosure.
Figure 5A:
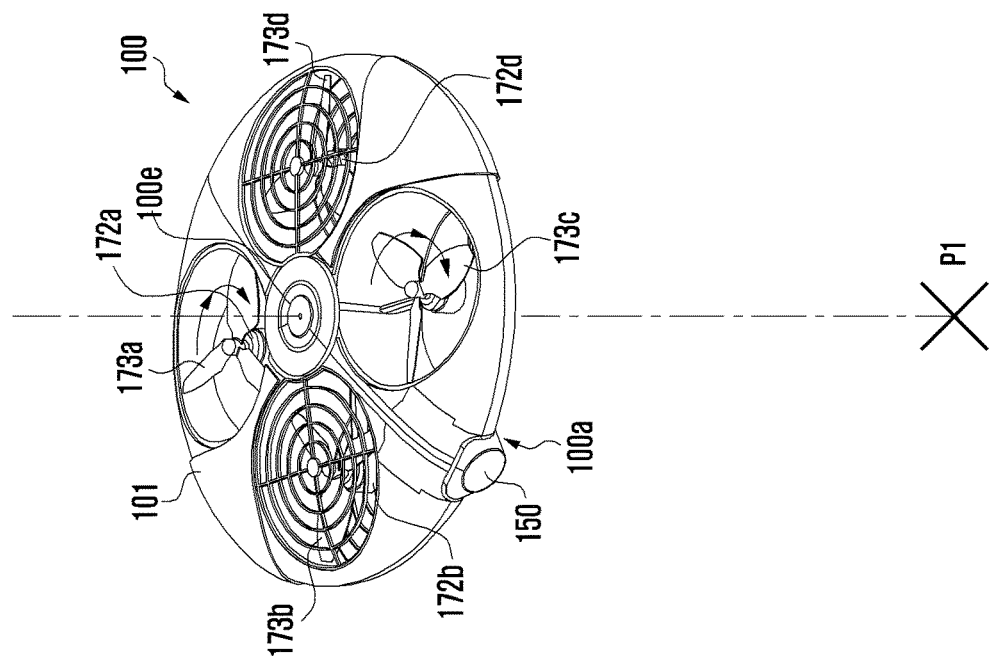

With reference to FIG. 5A, the UAV 100 is hovering at the first position P1. The UAV 100 may hover at the first position P1 under the control (e.g., manual flying) of the remote controller 10 or the control (e.g., automatic flying) of the controller 110 of the UAV 100. The UAV 100 may hover at the first position P1 according to a preset function (e.g., a hovering mode). Further, the UAV 100 may hover at the first position P1 according to a preset function (e.g., a manual hovering mode) under the control of the remote controller 10 or a preset function under the control (e.g., an automatic hovering mode) of the controller 110 of the UAV 100.

In an embodiment of the present disclosure, hovering of the UAV 100 may include flying of the UAV 100 in a three-dimensional space. Hovering of the UAV 100 may include flying of the UAV 100 at a position and altitude in a three-dimensional space.

In an embodiment of the present disclosure, a hovering mode may include a manual hovering mode or an automatic hovering mode. Further, hovering may include hovering in a manual hovering mode or hovering in an automatic hovering mode.

The first position P1 may correspond to a three-dimensional space of a flying UAV. The first position P1 of FIG. 5A (two-dimensional drawing) represents a position of the hovering UAV 100 in a three-dimensional space by a two-dimensional space (e.g., except for the height h1 which could be 2 m). In an embodiment of the present disclosure, the first position P1 may mean a position in a three-dimensional space. The first position P1 may mean a reference position for return of the UAV 100. The first position P1 may be referred to as a first reference position. Further, the first position P1 may be a position corresponding to a time point when a user grip is received by the hovering UAV 100.

The UAV 100 may hover at the first position P1 using the sensor 160 and the driving unit 170. The controller 110 of the UAV 100 may calculate the first position P1 using the positioning information receiver 155 and the optical flow sensor 165. The controller 110 of the UAV 100 may calculate the first position P1 using the positioning information receiver 155, the barometer 164, and the optical flow sensor 165. Further, the UAV 100 may control the driving unit 170 to correspond to the calculated first position P1 to hover at the first position P1.

The controller 110 of the UAV 100 may calculate a capacitance value before a user grip through the grip sensor 166. The controller 110 of the UAV 100 may store a calculated capacitance value before a user grip in the storage unit 185. Further, the controller 110 of the UAV 100 may store a calculated capacitance value before a user grip in the storage unit 185 for a preset period.

At step S420 of FIG. 4, a user grip is detected on the UAV.

Figure 5B:
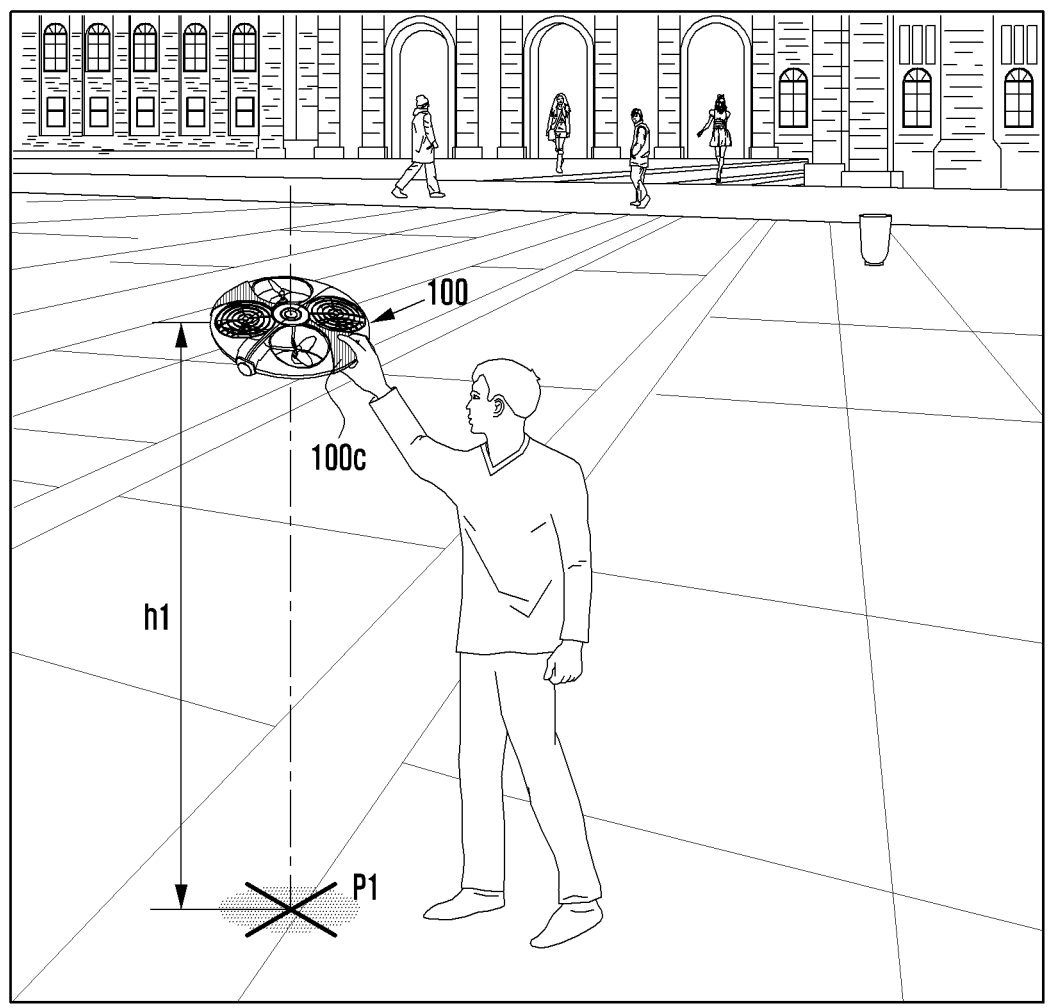

With reference to FIG. 5B, the user grips the hovering UAV 100 at the first position P1. The user may grip a portion except for the opening 101a of a surface of the housing 101 of the hovering UAV 100 at the first position P1. Further, the user may grip the conductive pattern 166a or 166b positioned on a surface of the housing 101 of the hovering UAV 100 at the first position P1.

The controller 110 of the UAV 100 may detect a user grip on the hovering UAV 100 at the first position P1.

When the user grips the UAV 100, the controller 110 of the UAV 100 may calculate a capacitance value through the grip sensor 166. The controller 110 of the UAV 100 may detect a user grip using a change of a capacitance value through the grip sensor 166. The grip sensor 166 may output a signal corresponding to a capacitance change from a user grip to the controller 110.

A capacitance change may include one of a relative change of capacitance and an absolute change of capacitance. For example, the relative change of capacitance may include a change of 10% or more based on a capacitance value before a user grip, a change of 50% or more based on a capacitance value before a user grip, a change of 60% or more based on a capacitance value before a user grip, and a change of 70% or more based on a capacitance value before a user grip. Further, a capacitance change may include a change of 100% or more based on a capacitance value before a user grip.

The absolute change of a capacitance may include a change by 2 pF or more further than a capacitance value before a user grip, a change by 5 pF or more further than a capacitance value before a user grip, a change by 6 pF or more further than a capacitance value before a user grip, or a change by 7 pF or more further than a capacitance value before a user grip. Further, a capacitance change may include a change by 10 pF or more further than a capacitance value before a user grip.

In FIG. 5B, when the user grips a portion except for the opening 101a of a surface of the housing 101 of the hovering UAV 100 at the first position P1, a capacitance change may occur in a plurality of grip detection circuits of the UAV 100.

With reference to FIGS. 1A, 3, and 5B, when the user grips a partial area 101c of a surface of the housing 101 of the hovering UAV 100, a user grip may be detected at one grip detection circuit 166s3 connected to a circuit between the ESC 171c and the motor 172c.

With reference to FIGS. 1A, 3, and 5B, when the user grips a partial area 101c of a surface of the housing 101 of the hovering UAV 100, each user grip may be detected at a grip detection circuit 166s3 connected to a circuit between the ESC 171c and the motor 172c, which is the left side of the received partial area 101c and a grip detection circuit 166s4 connected to a circuit between the ESC 171d and the motor 172d, which is the right side of the partial area 101c. Further, a user grip may be detected even at one grip detection circuit of an additional grip detection circuit 166s2 and grip detection circuit 166s2 as well as the grip detection circuit 166s3 and the grip detection circuit 166s4.

The grip sensor 166 may output a signal corresponding to a capacitance change occurring by a user grip to the controller or sensor processor.

The controller 110 of the UAV 100 may store a capacitance value corresponding to a user grip of the UAV 100 at the storage unit 185. Further, the controller 110 of the UAV 100 may store a capacitance value after a user grip of the UAV 100 at the storage unit 185 for a preset period.

At step S430 of FIG. 4, hovering of the UAV is turned off.

Figure 5C:
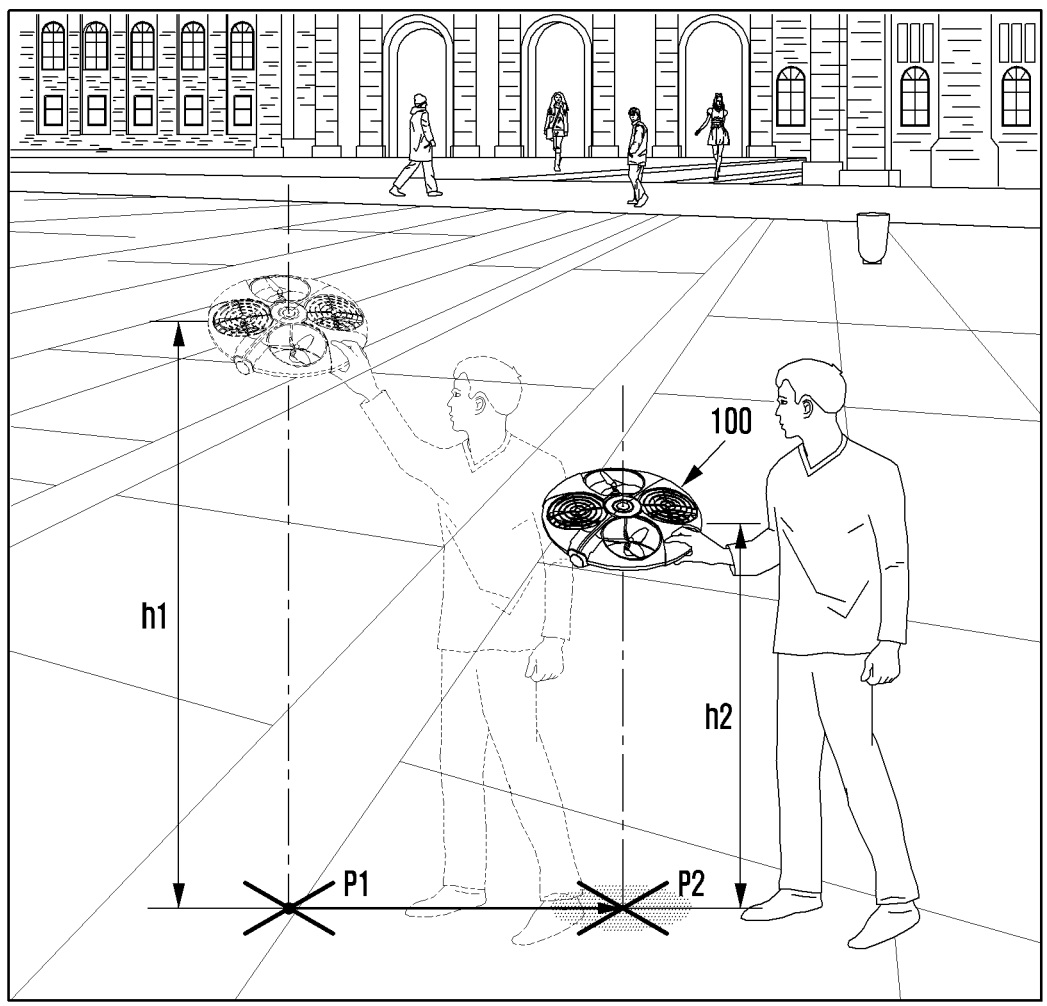

With reference to FIG. 5C, when an interruption corresponding to a capacitance change is received, the controller 110 may detect a user grip.

When a user grip is detected, the controller 110 may stop hovering of the UAV 100 at the first position P1. When a user grip is detected, the controller 110 may stop a hovering mode at the first position P1. Further, when a user grip is detected, the controller 110 may stop hovering of the UAV 100 in a hovering mode at the first position P1.

When hovering at the first position P1 is stopped, the driving unit 170 of the UAV 100 may continue to operate (e.g., motor rotation). When hovering of the first position P1 is stopped, the motors 172a to 172d may continue to rotate (e.g., about 30% to 50% of the motor rotation of a hovering state or the motor rotation that can prevent a crash of the UAV 100) under the control of the controller 110 of the UAV 100. When hovering at the first position P1 is stopped, the controller 110 of the UAV 100 may continue to rotate the motors 172a to 172d in preparation for release of the user grip.

In an embodiment of the present disclosure, hovering off may mean termination of hovering or a hovering mode of the UAV 100. Further, hovering off may mean a deceleration of the motor 172.

The user may move the gripped UAV from the first position P1 to a second position P2 (e.g., the height h2, which could be 1.1 m). In order to determine a state of the UAV 100 gripped at the first position P1, the user may move the UAV 100 to the second position P2. In an embodiment of the present disclosure, the second position P2 may be a position in a three-dimensional space like the first position P1. The second position P2 may be different from the first position P1 in a three-dimensional space. Further, the second position P2 may be a position corresponding to the point the UAV was at when the user released the UAV. A description of the second position P2 is substantially similar to that of the first position P1; therefore, a detailed description thereof will not be repeated.

The controller 110 of the UAV 100 may periodically detect or calculate a position change (e.g., a movement from the first position P1 to the second position P2) of the UAV 100 due to a user gripping and moving the UAV. The controller 110 of the UAV 100 may detect or calculate a position change of the UAV 100 by a user gripping and moving the UAV using the positioning information receiver 155. The controller 110 of the UAV 100 may detect or calculate a position change of the UAV 100 by a user gripping and moving the UAV using the positioning information receiver 155 and the barometer 165. Further, the controller 110 of the UAV 100 may detect or calculate a position change of the UAV 100 by a user gripping and moving the UAV using the positioning information receiver 155 and the sensors 161 to 164.

The user may determine a state (e.g., battery low) of the UAV 100 gripped at the second position P2. The user may replace the battery 195 of the UAV 100 gripped at the second position P2. The user may replace a memory card, which is one of the storage unit 185 of the UAV 100 gripped at the second position P2. Further, the user may replace one of the motors 172 (e.g., 172a to 172d), or one of propellers 173 (e.g., 173a to 173d) of the UAV 100 gripped at the second position P2.

At the second position P2, the controller 110 of the UAV 100 gripped by the user may control the operation of (e.g., pairing attempt) the communication unit 120.

Figure 5D:
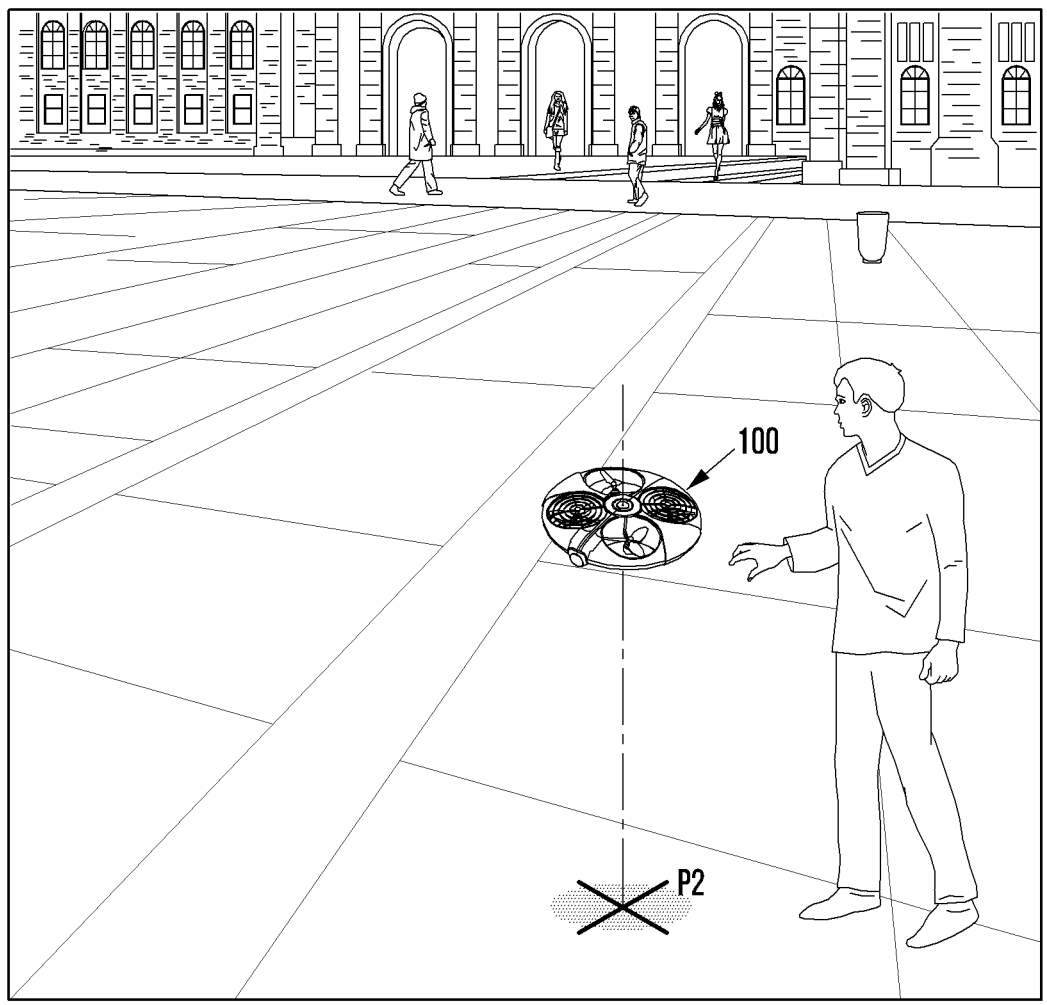
Figure 5E:
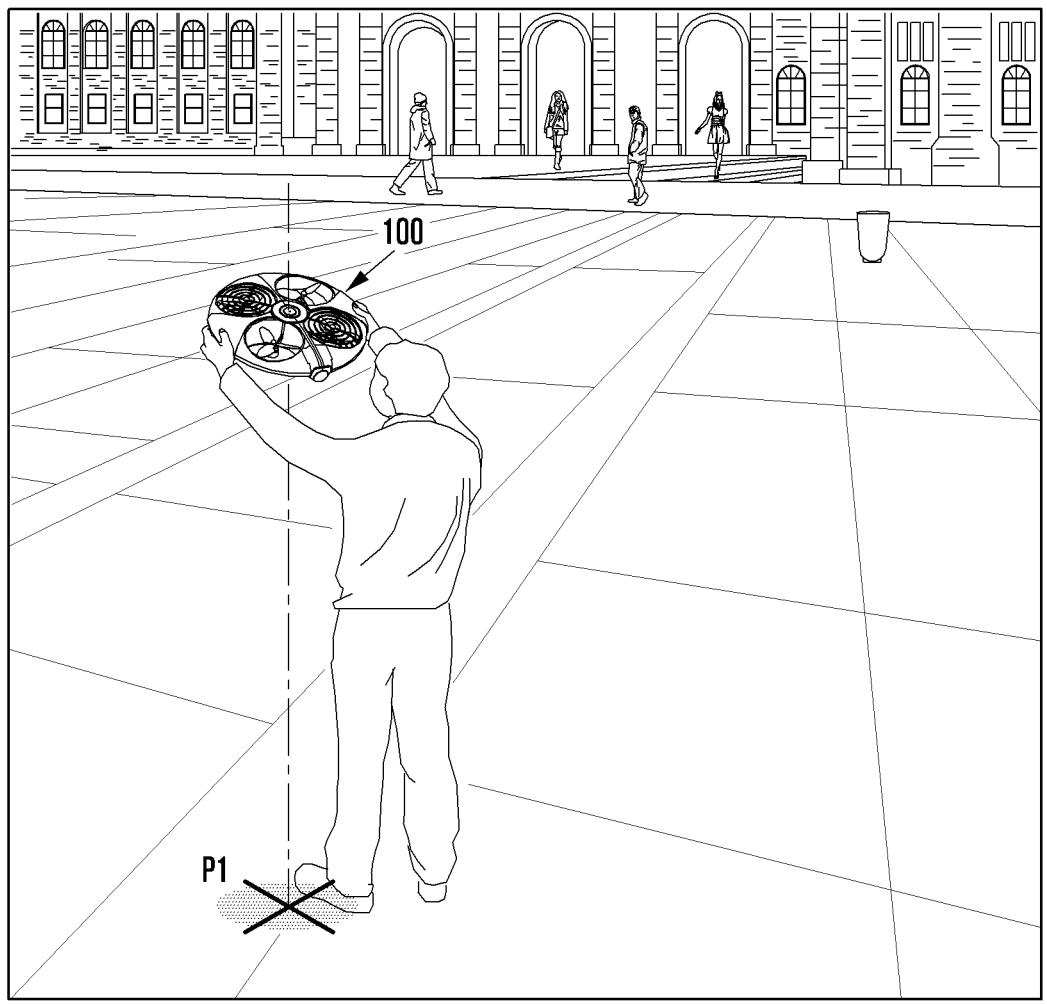

With reference to FIG. 5E, the user may grip the UAV 100 with both hands. Detection of a grip of the UAV with both hands as illustrated in FIG. 5E is substantially similar to that of a grip of the UAV with one hand as illustrated in FIG. 5B, therefore, a detailed description thereof will not be repeated.

The controller 110 of the UAV 100 may stop operation of the motor 172 according to grip detection of the UAV 100 by both hands of the user. The controller 110 of the UAV 100 may stop a rotation of some motors 172 (e.g., 172a to 172d) according to grip detection of the UAV 100 by both hands of the user. Further, the controller 110 of the UAV 100 may control the communication unit 120 (e.g., pairing attempt) according to grip detection of the UAV 100 by both hands of the user.

At step S440 of FIG. 4, release of the user grip is detected by the UAV.

With reference to FIG. 5D, the user releases hold of the UAV 100 at the second position P2. The user may release a grip of a portion of a surface of the housing 101 of the UAV 100 at the second position P2. Further, the user may release a grip of the conductive pattern 166a or 166b positioned at a surface of the housing 101 of the UAV 100 at the second position P2. Further, a third position corresponding to release of the user grip of the UAV 100 may be at a different location than the second position P2. The user may release a user grip of the UAV at the third position.

When the user releases a grip of the UAV 100, the controller 110 of the UAV 100 may calculate a capacitance value through the grip sensor 166. The controller 110 of the UAV 100 may detect release of the user grip using a change of a capacitance value through the grip sensor 166. The grip sensor 166 may output an interruption corresponding to a capacitance change by release of the user grip to the controller 110. The grip sensor 166 may output an interruption corresponding to a capacitance change by a user grip to the controller or sensor processor.

At step S440 of FIG. 4, detection of the user grip release is substantially similar (e.g., return to a capacitance value before a user grip) to grip detection of the user at step S420 of FIG. 4; therefore, a detailed description thereof will not be repeated.

At step S450 of FIG. 4, the UAV changes hovering positions to the second position P2.

With reference to FIG. 5D, at the second position, hovering of the UAV is turned on. When an interruption corresponding to a capacitance change is received, the controller 110 may detect release of the user grip.

When release of the user grip is detected, the controller 110 may turn on hovering of the UAV at the second position P2. When release of the user grip is detected, the controller 110 may turn on a hovering mode at the second position P2. Further, when release of the user grip is detected, the controller 110 may turn on hovering mode at the second position P2. Before release of the user grip is detected, the controller 110 may be hovering the UAV at the first position P1 and after the release of the user grip is detected, the controller 110 may hover the UAV at the second position P2.

When release of the user grip is detected, the controller 110 may increase the rotation speed of the motor 172 for hovering of the UAV 100 at the second position P2. When release of the user grip is detected, the controller 110 may compare a rotation speed of the motor 172 with a rotation speed at the first position according to the detected release of the user grip and control the ESC 171 and the motor 172 to increase the rotation speed of the motor 172.

When release of the user grip is detected or when hovering of the second position P2 is started, the controller 110 of the UAV 100 may calculate the second position P2 using the positioning information receiver 155 and the optical flow sensor 165. When release of the user grip is detected or when hovering of the second position P2 is started, the controller 110 of the UAV 100 may calculate the second position P2 using the positioning information receiver 155, the barometer 164, and the optical flow sensor 165. Further, when release of the user grip is detected or when hovering of the second position P2 is started, the UAV 100 controls the driving unit 170 to correspond to the calculated second position P2 to be hovered at the second position P2.

In another embodiment of the present disclosure, when release of the user grip is detected or when the UAV 100 starts hovering at the second position P2, the controller 110 of the UAV 100 may reset the second position P2 to a second reference position similar to a first reference position set at the first position P1.

When the UAV 100 is reset at the second reference position, the controller 110 of the UAV 100 may calculate the second reference position using the positioning information receiver 155 and the optical flow sensor 165.

The UAV 100 may hover at the second position P1 using the sensor 160 and the driving unit 170. When the UAV 100 starts hovering at the second position P2, the driving unit 170 of the UAV 100 may continue to operate.

When the UAV 100 starts hovering according to release of the user grip, the controller 110 of the UAV 100 may not return the UAV to the first position P1. When the UAV 100 starts hovering according to release of the user grip, the controller 110 of the UAV 100 may not return the UAV from the second position P2 to the first position P1. When the UAV 100 starts hovering at the second position P2 by an external force (e.g., wind) instead of release of the user grip, the controller 110 of the UAV 100 may return the UAV to the first position P1.

At step S450 of FIG. 4, at the second position P2, when the UAV 100 hovers, a flying control method may be terminated.

Methods according to the present disclosure may be implemented into a program instruction form that may be performed through computer means that are recorded in a computer readable medium. The computer readable medium may include a program instruction, a data file, and a data structure in single or in combination form. For example, the computer readable medium may be stored at a volatile or nonvolatile storage device such as a storage device of an ROM regardless of whether it may be deleted or re-recorded; a memory such as an RAM, memory chip, device, or IC; or a storage medium that may be optically or magnetically recorded such as a compact disc (CD), digital versatile disk (DVD), magnetic disk, or magnetic tape and that may be read simultaneously with a machine.

A memory that may be included within a UAV is an example of a storage medium that may be read with a program including instructions that implement embodiments of the present disclosure or a machine appropriate for storage of programs. The program instruction recorded at the medium may be specially designed and configured for the present disclosure or may be known to and used by a person of ordinary skill in the art of computer software development.

A UAV and a flying control method thereof may decelerate a motor rotation speed to correspond to a user grip detected using a grip detection circuit.

A UAV and a flying control method thereof may accelerate a motor rotation speed to correspond to release of a user grip detected using a grip detection circuit.

Although embodiments of the present disclosure have been described in detail herein, it should be clearly understood that many variations and modifications of the present disclosure herein described, which may appear to those skilled in the art, will still fall within the spirit and scope of the of the present disclosure as defined in the appended claims and their equivalents.

What is claimed is:

1. An unmanned aerial vehicle, comprising:
   a housing having a conductor at a surface;
   a positioning information receiver;
   at least one sensor that detects a flight state of the unmanned aerial vehicle;
   a driving unit comprising an electronic speed controller (ESC) and a motor that operates to fly the unmanned aerial vehicle;
   a grip detection circuit positioned within the unmanned aerial vehicle that receives a user grip, the grip detection circuit being electrically connected to the conductor; and
   a processor that is connected to the positioning information receiver, the at least one sensor, the driving unit, and the grip detection circuit,
   wherein one end of the grip detection circuit is connected to a circuit between the ESC and the motor of the driving unit and another end of the grip detection circuit is connected to the processor,
   wherein the conductor is electrically connected to the circuit between the ESC and the motor,
   wherein the processor is configured to detect a user grip through the conductor by detecting a capacitance change of the grip detection circuit of the flying unmanned aerial vehicle that corresponds to the user grip,
   wherein the processor is configured to control the driving unit based on detection of the user grip and release of the user grip through the grip detection circuit, the positioning information receiver, and the at least one sensor,
   wherein the processor is further configured to control the driving unit to stop a hovering mode of the unmanned aerial vehicle, when the user grip is detected at a first position set as a reference position,
   wherein the processor is further configured to control the driving unit to turn on the hovering mode, when the release of the user grip is detected at a second position moved from the first position, and reset the second position to the reference position for the hovering mode, and
   wherein, when receiving the user grip at the second position, the processor is further configured to control a pairing attempt with an external electronic device.

2. The unmanned aerial vehicle of claim 1, wherein the at least one sensor comprises one of an acceleration sensor, a magnetometer, a gyro sensor, a barometer, and an optical flow sensor.

3. The unmanned aerial vehicle of claim 1, wherein one end of the grip detection circuit is connected to a circuit between the ESC of the driving unit and the motor, and the other end of the grip detection circuit is connected to the processor.

4. The unmanned aerial vehicle of claim 1, wherein one end of the grip detection circuit is connected to a circuit between the ESC of the driving unit and the motor, and the other end of the grip detection circuit is connected to a grip sensor and the processor.

5. The unmanned aerial vehicle of claim 1, wherein the grip detection circuit comprises a plurality of grip detection circuits, and
   wherein the processor detects a capacitance change at an adjacent left grip detection circuit and a right grip detection circuit according to a position of the user grip.

6. The unmanned aerial vehicle of claim 1, wherein the conductor comprises a conductive pattern disposed on the surface of the housing,
   wherein the processor receives a user grip through the conductive pattern.

7. The unmanned aerial vehicle of claim 6, wherein one end of the grip detection circuit is connected to a circuit between the ESC of the driving unit connected to the conductive pattern and the motor, and the other end of the grip detection circuit is connected to the processor.

8. The unmanned aerial vehicle of claim 6, wherein one end of the grip detection circuit is connected to a circuit between the ESC of the driving unit connected to the conductive pattern and the motor, and the other end of the grip detection circuit is connected to a grip sensor which is connected to the processor.

9. The unmanned aerial vehicle of claim 6, wherein the processor detects a capacitance change of the grip detection circuit that corresponds to the user grip.

10. The unmanned aerial vehicle of claim 1, wherein a number of the grip detection circuits is less than or equal to a number of motors.

11. The unmanned aerial vehicle of claim 1, wherein a number of the grip detection circuits is less than or equal to a number of ESCs.

12. The unmanned aerial vehicle of claim 1, wherein the processor controls the driving unit to drive the unmanned aerial vehicle to the second position when the user grip is released and when the second position is different from the first position.

13. The unmanned aerial vehicle of claim 1, wherein the processor controls the driving unit to terminate driving of the unmanned aerial vehicle at the first position in accordance with detection of the user grip.

14. The unmanned aerial vehicle of claim 1, wherein the processor detects a capacitance change of the grip detection circuit corresponding to release of the user grip.

* * * * *